(12) United States Patent
Hashimoto

(10) Patent No.: US 7,131,194 B2
(45) Date of Patent: Nov. 7, 2006

(54) METHOD OF MANUFACTURING A DEVICE

(75) Inventor: Takashi Hashimoto, Chino (JP)

(73) Assignee: Seiko Epson Corporation (JP)

(*) Notice: Subject to any disclaimer, the term of this patent is extended or adjusted under 35 U.S.C. 154(b) by 313 days.

(21) Appl. No.: 10/420,522

(22) Filed: Apr. 22, 2003

(65) Prior Publication Data
US 2004/0016115 A1    Jan. 29, 2004

(30) Foreign Application Priority Data
Apr. 22, 2002   (JP)   .............................. 2002-119447

(51) Int. Cl.
H05K 3/30   (2006.01)
(52) U.S. Cl. .................. 29/831; 29/592.1; 29/606; 29/832; 29/846; 29/850; 29/854; 29/885; 174/260; 427/129; 427/130
(58) Field of Classification Search .............. 29/592.1, 29/605, 606, 831, 832, 841, 846, 850, 854, 29/856, 858, 885; 174/260; 427/129, 130
See application file for complete search history.

(56) References Cited

U.S. PATENT DOCUMENTS

| | | | | |
|---|---|---|---|---|
| 6,002,592 A | * | 12/1999 | Nakamura et al. | 361/760 |
| 6,020,048 A | * | 2/2000 | Oka et al. | 428/209 |
| 6,143,116 A | * | 11/2000 | Hayashi et al. | 156/233 |
| 6,197,407 B1 | * | 3/2001 | Andou et al. | 428/209 |
| 6,596,406 B1 | * | 7/2003 | Ikeda et al. | 428/474.4 |

FOREIGN PATENT DOCUMENTS

| | | |
|---|---|---|
| JP | 03-270292 | 12/1991 |
| JP | 05-090750 | 4/1993 |
| JP | 06053654 A * | 2/1994 |
| JP | 06-199032 | 7/1994 |
| JP | 10-064331 | 3/1998 |
| JP | 11-163499 | 6/1999 |

OTHER PUBLICATIONS

"Development of core-less substrate for multi wiring layers"; Maehara, M.; Kato, I.; Akimoto, S.; Okuma, T.; Iino, R.; Tsukamoto, T.; Electronics Packaging Technology Conference, 2002. 4th; Dec. 10-12, 2002; pp. 280-284.*
Communication from Japanese Patent Office regarding counterpart application.

* cited by examiner

Primary Examiner—Paul D. Kim
(74) Attorney, Agent, or Firm—Harness, Dickey & Pierce, P.L.C.

(57) ABSTRACT

Wirings 2B1 are formed by application of heat treatment after an ink jet system is used to discharge a conductive liquid L onto a provisional substrate 5 having a predetermined repellent property, bonding an insulating layer 4B1 to the wirings 2B1 with an adhesive material 3B1 therebetween, peeling and removing the provisional substrate 5, and bonding and fixing the wirings 2B1 together with the insulating film 4B1 to a main substrate 1 by an adhesive material 3B1.

11 Claims, 8 Drawing Sheets (a)

(b)

(c)

(a)

(b)

(a)

(b)

(a)

(b)

METHOD OF MANUFACTURING A DEVICE

BACKGROUND OF THE INVENTION

1. Technical Filed

The present invention relates to a method of manufacturing a device, a device, a non-contact type card medium, and electronic equipment.

2. Related Art

As well known, the photolithographic method is generally used to form printed-circuit boards incorporated into various electronic equipment and wiring patterns in various semiconductor devices. The photolithographic method comprises using an etching processing to repeatedly leave only necessary portions on a film formed on a substrate and remove remaining portions to form various circuit elements and wiring patterns on the substrate. Such a photolithographic method uses the etching processing to repeatedly remove many portions of the film, and so involves a disadvantage that a material for formation of a film is wasted. As a method of overcoming such disadvantage, there has been proposed a method of directly forming a wiring pattern in a painting manner by the use of an ink jet system to continuously discharge a conductive liquid sequentially and locally on a substrate.

However, the method of forming a wiring pattern with the use of the ink jet system involves the following problems. More specifically, since a repellent property is required of a substrate, on which a conductive liquid is discharged, in forming a fine wiring pattern having a large film thickness, it is necessary to subject a surface of a substrate to surface preparation for ensuring a repellent property as a pretreatment, and so such surface preparation makes a manufacturing process complex. Also, in order to impart a repellent property of a certain level to various kinds of substrates, it is necessary to search for conditions of surface preparation conforming to a material of an associated substrate, and to set conditions of surface preparation conforming to a substrate material when an actual wiring pattern is formed. Also, some substrate materials cannot realize conditions of surface preparation for imparting a repellent property of a certain level, that is, some substrate materials make conditions of surface preparation very difficult. Further, while it has been proposed to use the ink jet system to form an interlayer insulating film in the case of forming multilayer wirings, a manufacturing process is made complex because it is necessary to form a wiring pattern by carrying out the surface preparation every time an interlayer insulating film is formed.

Meanwhile, in the case where the ink jet system is used to form a wiring pattern, a conductive liquid discharged onto a substrate surface must be converted into a conductive film with heat treatment, and so substrate materials are required to endure such heat treatment. For example, a substrate made of plastics does not posses resistance to the heat treatment, so that it cannot be employed in a method of forming a wiring pattern with the ink jet system.

The invention has been provided in view of the above problems, and has the following objects.

To form a favorable wiring pattern irrespective of a quality of a substrate material with the use of the ink jet system.

(2) To form a wiring pattern by the use of the ink jet system without performing surface preparation for imparting a repellent property of a certain level.

(3) To simplify the steps of forming a multilayer wiring with the use of the ink jet system.

SUMMARY

To attain the objects, the invention adopts, as a first aspect relating to a method of manufacturing a device, a configuration comprising the steps of (a) forming first wirings on a provisional substrate, (b) mounting an insulating body on the first wirings to form a laminated body of the first wirings and the insulating body, (c) peeling off the laminated body from the provisional substrate, and (d) mounting the laminated body on a main substrate.

Also, in a second aspect relating to a method of manufacturing a device, there is adopted a configuration, in which in the step (a), before the first wirings are formed, a surface of the provisional substrate possesses a property permitting the first wirings and the provisional substrate to peel off in the step (c).

In a third aspect relating to a method of manufacturing a device, there is adopted a configuration, in which the property permitting peeling off comprises a repellent property.

In a fourth aspect relating to a method of manufacturing a device, there is adopted a configuration, in which in the step (a), the first wirings are formed by means of a droplet discharge method.

In a fifth aspect relating to a method of manufacturing a device, there is adopted a configuration, in which the step (b) comprises bonding an insulating film to the first wirings.

In a sixth aspect relating to a method of manufacturing a device, there is adopted a configuration, in which in the step (d), second wirings are initially formed on the main substrate and the laminated body is mounted on the main substrate in a manner to provide conduction between the second wirings and the first wirings.

In a seventh aspect relating to a method of manufacturing a device, there is adopted a configuration, in which in the step (d), circuit terminals are first formed on the main substrate and the laminated body is mounted on the main substrate in a manner to provide conduction between the circuit terminals and the first wirings.

In a eighth aspect relating to a method of manufacturing a device, there is adopted a configuration of the method of manufacturing a device, wherein openings are formed on the insulating body to expose at least a part of the first wirings.

In a ninth aspect relating to a method of manufacturing a device, there is adopted a configuration, in which the openings are first formed on the insulating body prior to the step (b).

In a tenth aspect relating to a method of manufacturing a device, there is adopted a configuration further comprising, after the step (d), a step (e) of forming a conductive layer on the openings.

In an eleventh aspect relating to a method of manufacturing a device, there is adopted a configuration, in which the step (e) is effected by means of a droplet discharge method.

In a twelfth aspect relating to a method of manufacturing a device, there is adopted a configuration, in which the droplets comprise liquid bodies containing fine metallic particles.

In a thirteenth aspect relating to a method of manufacturing a device, there is adopted a configuration, in which multilayer wirings are formed by forming at least one or more new laminated bodies formed in the same step as that, in which the laminated body is formed, on the laminated body.

Further, the invention adopts, in aspects relating to a device, a configuration, in which the device is manufactured according to the method of manufacturing a device described above.

Also, the invention adopts, in aspects relating to a non-contact type card medium, a configuration, in which an antenna circuit is manufactured according to the method of manufacturing a device described above.

Also, the invention adopts an aspect of configuring electronic equipment by means of the aspects relating to a device described above.

DETAILED DESCRIPTION

An explanation will be given below to a method of manufacturing a device, according to the invention, and embodiments of a device, a non-contact type card medium, and an electronic equipment with reference to the drawings.

In addition, a droplet discharge method referred to in the invention is one, in which liquid droplets are discharged into a desired region to form a desired pattern including a substance being discharged, and the method is in some cases called an ink jet method. In this case, however, discharged liquid droplets do not correspond to so-called ink used in printing but comprise a liquid body containing a material constituting a device, the material containing, for example, a conductive substance constituting a device, or a substance capable of functioning as an insulating substance. Further, droplet discharging is not limited to atomizing at the time of discharging but includes the case where droplets of a liquid body are continuously (successively) discharged drop by drop.

Figure 1:
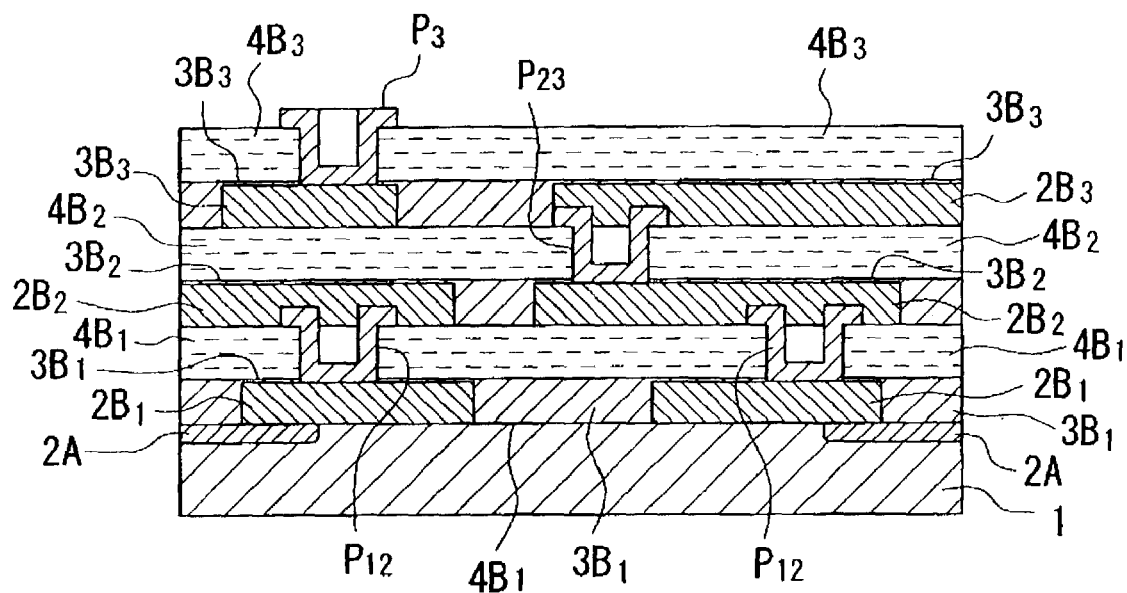
FIG. 1 is a cross sectional view showing part of a multilayer wiring pattern according to an embodiment of the invention.

FIG. 1 is a cross sectional view showing part of a multilayer wiring pattern according to an embodiment. In the figure, the reference numeral 1 denotes a substrate, 2A terminals, 2B1, 2B2 and 2B3 wirings, 3B1, 3B2 and 3B3 adhesive layers, 4B1, 4B2 and 4B3 insulating layers (adhesive material), and P12, P23, P3 through-holes. The substrate 1 is a substrate made of, for example, glass.

The terminals 2A are made of a conductive material to make specific wirings constituting a part of wirings, which are embedded in the substrate 1 by processing the substrate 1. The wirings 2B1 among the respective wirings 2B1, 2B2 and 2B3 together with the adhesive layer 3B1 and the insulating layer 4B1 constitute a first layer, the wirings 2B1 being bonded to the insulating layer 4B1 by the adhesive layer 3B1 and connected to the terminals 2A and the through-holes P12 in the substrate 1. The wirings 2B2 together with the adhesive layer 3B2 and the insulating layer 4B2 constitute a second layer, the wirings 2B2 being bonded to the insulating layer 4B2 by the adhesive layer 3B2 and connected to the through-holes P12 and the through-hole P23. The wirings 2B3 together with the adhesive layer 3B3 and the insulating layer 4B3 constitute a third layer, the wirings 2B3 being bonded to the insulating layer 4B3 by the adhesive layer 3B3 and connected to the through-hole P23 and the through-hole P3.

The adhesive layer 3B1 among the respective adhesive layers 3B1, 3B2 and 3B3 is provided on a lower surface of the insulating layer 4B1 to bond the insulating layer 4B1 to the terminals 2A, the wirings 2B1, and the substrate 1. The adhesive layer 3B2 is provided on a lower surface of the insulating layer 4B2 to bond the insulating layer 4B2 to the wirings 2B2 and the insulating layer 4B1 of the first layer. The adhesive layer 3B3 is provided on a lower surface of the insulating layer 4B3 to bond the insulating layer 4B3 to the wirings 2B3 and the insulating layer 4B2 of the second layer.

The respective insulating layers 4B1, 4B2 and 4B3 are formed from, for example, polyimide, the insulating layer 4B1 being provided to ensure electric insulation between the first layer and the second layer, the insulating layer 4B2 being provided to ensure electric insulation between the second layer and the third layer, and the insulating layer 4B3 being provided to ensure electric insulation between the third layer and a fourth layer, illustration of which is omitted. In addition, in FIG. 1 the respective adhesive layers 3B1, 3B2 and 3B3 and the respective wirings 2B1, 2B2 and 2B3 are exaggeratedly depicted in thickness relative to the respective insulating layers 4B1, 4B2 and 4B3 for the sake of convenience. An actual thickness of the respective insulating layers 4B1, 4B2 and 4B3 is fairly larger than that of the respective adhesive layers 3B1, 3B2 and 3B3 and the respective wirings 2B1, 2B2 and 2B3.

The through-holes P12 among the respective through-holes P12, P23, P3 are formed in a state, in which they extend through the insulating layer 4B1 of the first layer in a vertical direction, thus connecting the wirings 2B1 of the first layer and the wirings 2B2 of the second layer together. The through-hole P23 is formed in a state, in which it extends through the insulating layer 4B2 of the second layer in the vertical direction, thus connecting the wirings 2B2 of the second layer and the wirings 2B3 of the third layer together. The through-hole P3 is formed in a state, in which it extends through the insulating layer 4B3 of the third layer in the vertical direction, thus connecting the wirings 2B3 of the third layer and the wiring of the fourth layer together.

Thus the multilayer wiring pattern is formed in a state to provide a multilayered structure on the substrate 1 and featured in such a structure that the terminals 2A and the respective wirings 2B1, 2B2 and 2B3 are placed in a desired state of connection by positioning of the respective layers and bonded in a multilayered manner by the respective adhesive layers 3B1, 3B2 and 3B3.

In addition, of course, a wiring pattern may be constituted by a monolayer, that is, only the first layer and the substrate 1 instead of a multilayer. In this case, since there is no need of forming the through-holes P12 through the insulating layer 4B1 of the first layer, there is used an insulating layer 4B1 in a completely flat shape, in which through-holes are not provided for formation of the through-holes P12. Also, a desired wiring pattern may be formed from a substrate without the terminals 2A, that is, a substrate with only the wirings 2B1 of the first layer.

Further, it is conceivable that a chip-shaped circuit element be interposed between the substrate 1 and the first layer. In this case, it is necessary to position the circuit element so that joining terminals of the circuit element are connected to the terminals 2A of the substrate 1 or the wirings 2B1 of the first layer.

Subsequently, a method of forming the multilayer wiring pattern will be described in detail with reference to FIGS. 2 to 8. In addition, FIGS. 2 to 8 are process drawings showing respective steps including first to seventh steps in the method of forming the multilayer wiring pattern.

Figure 2:
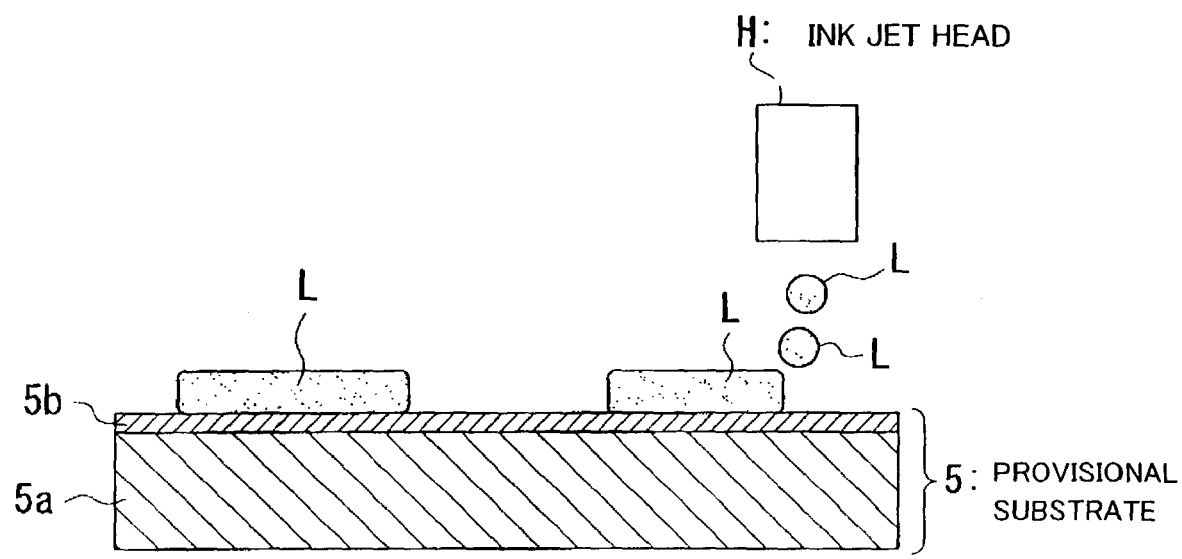
FIG. 2 is a cross sectional view showing a first step in a method of forming a multilayer wiring pattern, according to an embodiment of the invention.
Figure 3:
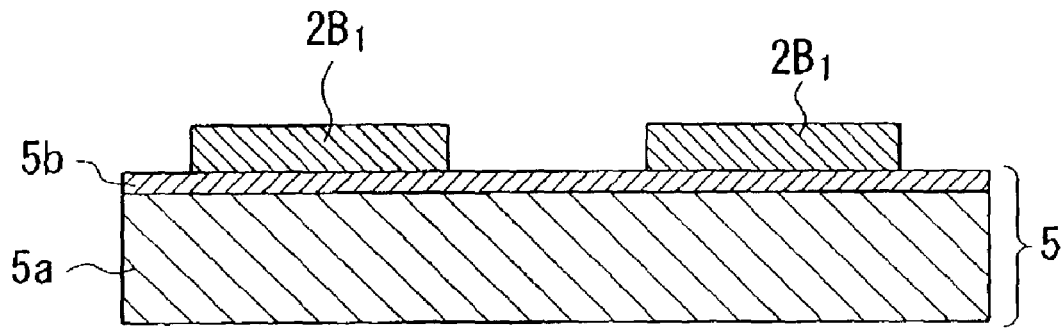
FIG. 3 is a cross sectional view showing a second step in the method of forming a multilayer wiring pattern, according to the embodiment of the invention.

In the first step, a conductive liquid L, for example, a liquid containing fine silver particles being a metal is discharged by the inkjet system through an ink jet head H onto a provisional substrate 5, which is provided by first depositing a peel film 5b on a surface of a flat-shaped backing material 5a as shown in FIG. 2. The peel film 5b possesses a repellent property of a desired level. And the conductive liquid L adhering to the peel film 5b of the provisional substrate 5 in a pattern is subjected to heat treatment (baking treatment) in a temperature environment of around 300° C. to make the wirings 2B1 (silver wiring) of the first layer (second step) as shown in FIG. 3.

Figure 4:
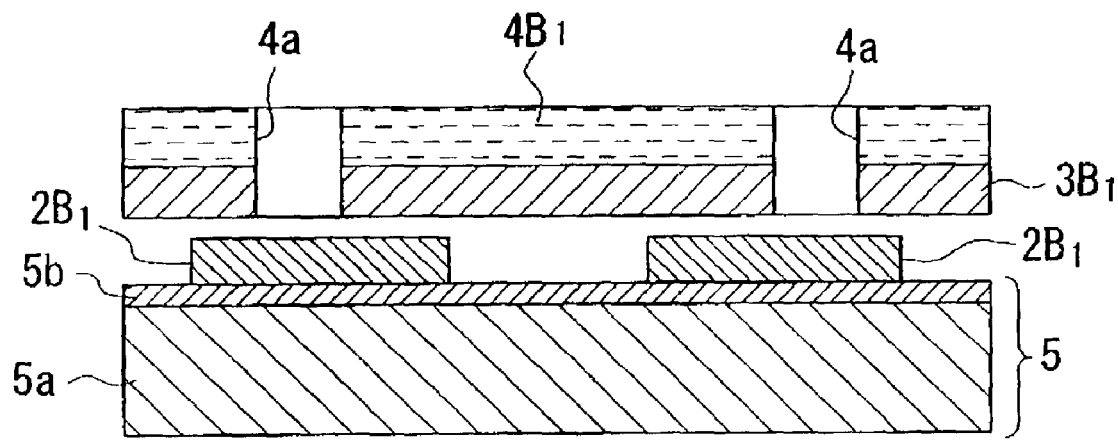
FIG. 4 is a cross sectional view showing a third step in the method of forming a multilayer wiring pattern, according to the embodiment of the invention.

When the wirings 2B1 are thus formed on the provisional substrate 5 (more particularly, directly on the peel film 5b), through-holes 4a for the through-holes P12 are first formed as shown in FIG. 4 and an insulating film provided on an underside thereof with the adhesive layer 3B1 is bonded to the wirings 2B1 (third step). In this case, the insulating film constitutes the insulating layer 4B1, the insulating film being positioned so that the through-holes 4a are disposed just above the predetermined wirings 2B1, and bonded to the wirings 2B1 and a part (portion, in which the wirings 2B1 are absent) of the peel film 5b by the adhesive layer 3B1.

Figure 5:
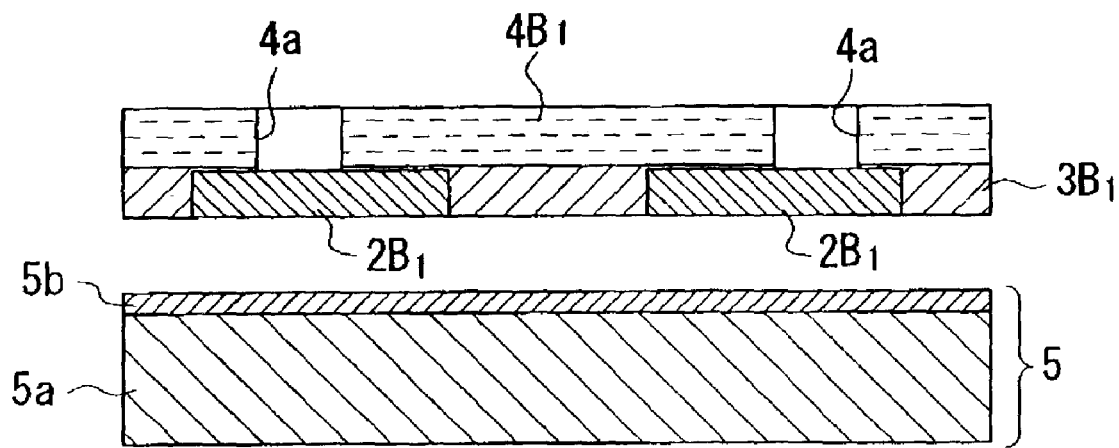
FIG. 5 is a cross sectional view showing a fourth step in the method of forming a multilayer wiring pattern, according to the embodiment of the invention.
Figure 6:
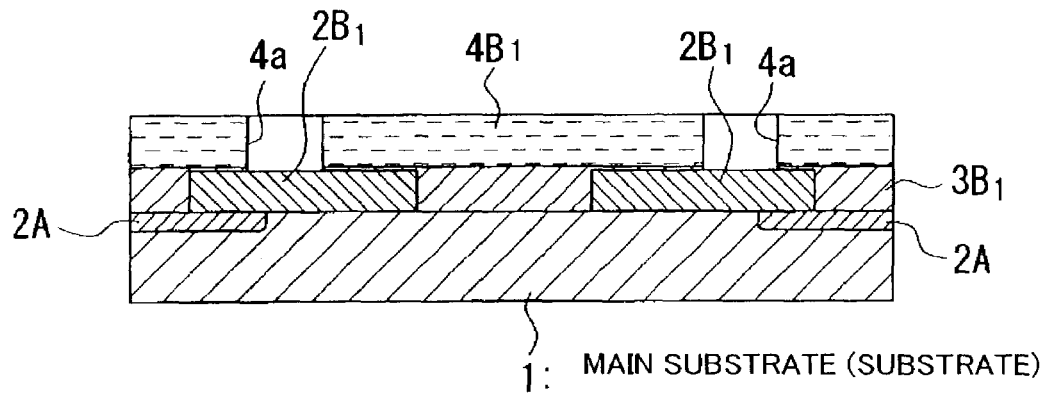
FIG. 6 is a cross sectional view showing a fifth step in the method of forming a multilayer wiring pattern, according to the embodiment of the invention.

In this state, the provisional substrate 5 together with the peel film 5b is peeled off to be removed (fourth step) as shown in FIG. 5. Since the peel film 5b possesses a favorable repellent property, it is excellent in peel property and so is easily peeled off from the adhesive layer 3B1. And in place of the provisional substrate 5, a main substrate, that is, the substrate 1 is bonded to the insulating film with the adhesive layer 3B1 therebetween as shown in FIG. 6 (fifth step). When the fifth step is completed, formation of the first layer on the substrate 1 is completed.

With such way of forming the first layer, instead of discharging the conductive liquid L directly on the substrate 1 to form the wirings 2B1, the conductive liquid L is discharged directly on the provisional substrate 5 (more particularly, the peel film 5b), on which a repellent property of a desired level is ensured, to form the wirings 2B1, and then bonded to the substrate 1, so that the wirings 2B1 having been formed on the basis of the ink jet system can be arranged on the substrate 1 irrespective of a material of the substrate 1, that is, a repellent property of the substrate 1.

Figure 7:
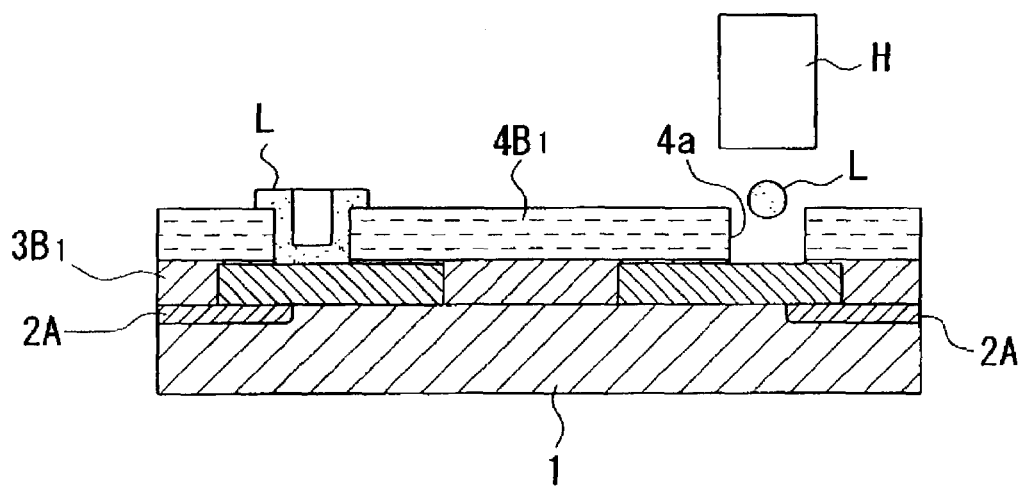
FIG. 7 is a cross sectional view showing a sixth step in the method of forming a multilayer wiring pattern, according to the embodiment of the invention.
Figure 8:
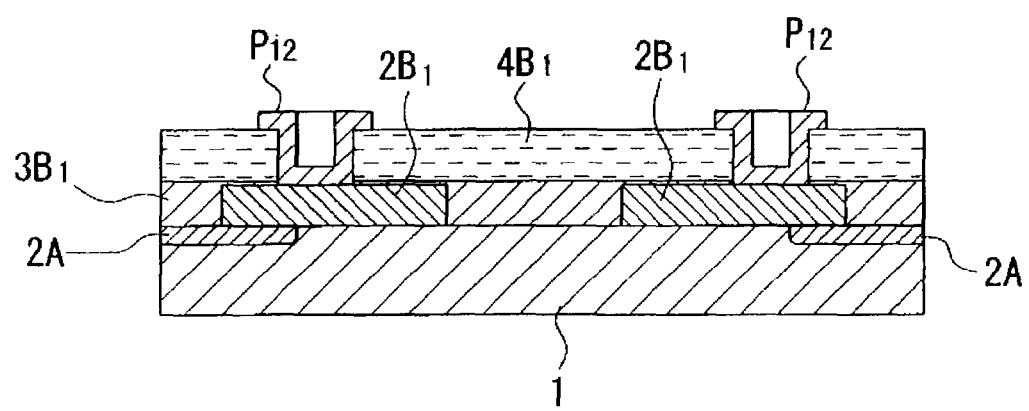
FIG. 8 is a cross sectional view showing a seventh step in the method of forming a multilayer wiring pattern, according to the embodiment of the invention.

When the first layer is thus formed, the ink jet head H has the conductive liquid L discharged toward areas of the peripheral edges of the through-holes 4a (sixth step) as shown in FIG. 7. As a result, surface tension acts to adhere the conductive liquid L to the wirings 2B1, the peripheral edges and areas of the upper ends of the through-holes 4a in a bridge-like manner as shown in the figure. In the same manner as in the second step, the through-holes P12 (silver through-holes) shown in FIG. 8 are then formed by subjecting the conductive liquid L to heat treatment (baking treatment) in a temperature environment of around 300° C. (seventh step). Further, by repeating the above respective steps, upper layers, that is, the second layer, the third layer, . . . and the through-holes P23, P3, . . . connecting the respective layers together are formed, and finally the multilayer wiring pattern shown in FIG. 1 is finished.

Further, configurations of multilayer wiring boards manufactured on the basis of the method of forming a multilayer wiring pattern will be described particularly with reference to front views shown in FIGS. 9 to 12. In addition, the multilayer wiring boards are two-layered boards composed of the substrate 1, the first layer, and the second layer, and an explanation will be given to structures of respective constituents corresponding to the above description.

Figure 9:
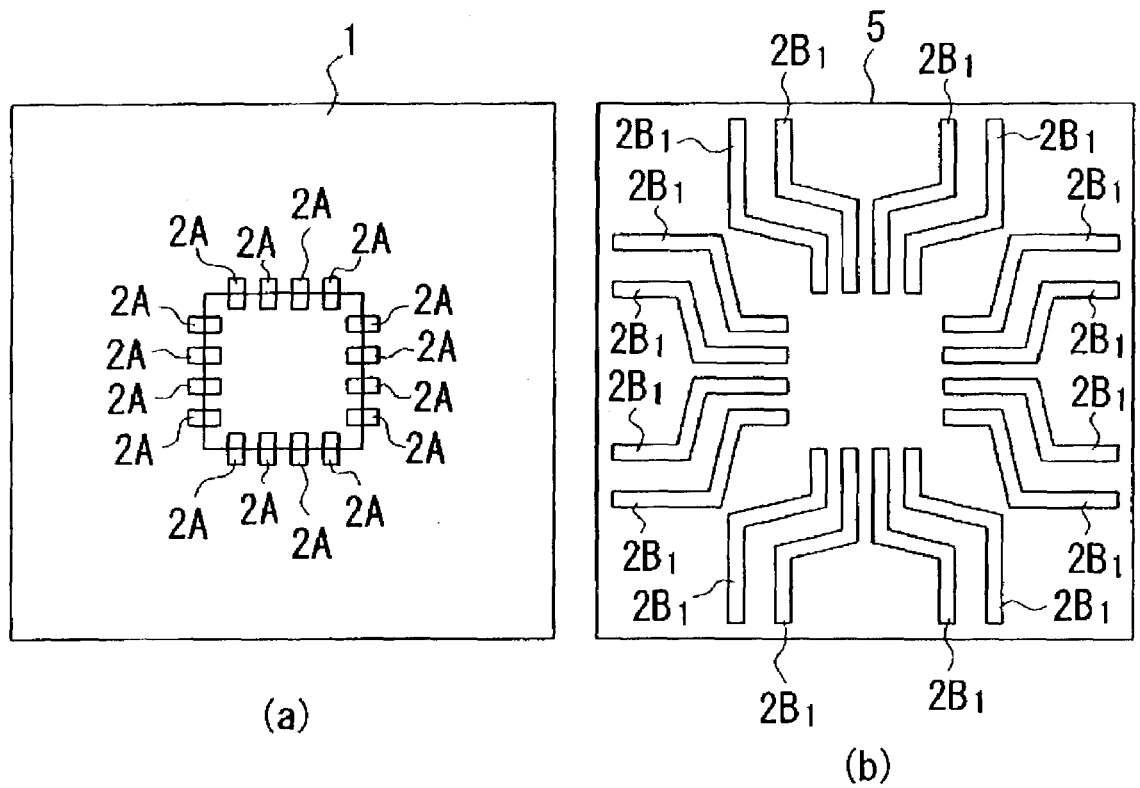
FIGS. 9(a)–9(c) are views showing a configuration of a multilayer wiring board according to an embodiment of the invention, 9(a) being a front view showing a substrate (main substrate), 9(b) being a front view showing a provisional substrate, on which wirings constituting a first layer are formed, and 9(c) being a front view showing an insulating film constituting the first layer.
Figure 9:
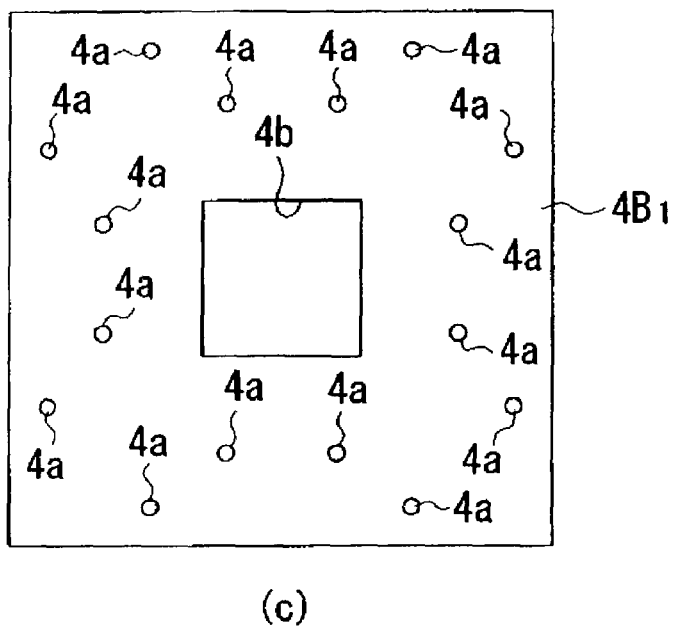

FIG. 9 is a front view showing the provisional substrate 5 and the insulating film (the insulating layer 4B1), which constitute the first layer, and a structure of the substrate 1. In FIG. 9, (a) is a front view showing the substrate 1 (main substrate), (b) is a front view showing the provisional substrate 5 in a state, in which the wirings 2B1 of the first layer are formed, and (c) is a front view showing the insulating film (the insulating layer 4B1) of the first layer.

As shown in FIG. 9(a), the terminals 2A are first embedded in the main substrate 1 to be formed. Also, the wirings 2B1 are formed as line patterns, which assume predetermined shapes and are arranged in predetermined positions, on the provisional substrate 5 by the ink jet system as shown in FIG. 9(b), while a plurality of through-holes 4a for formation of the through-holes P12 are arranged in predetermined positions and a terminal opening 4b for exposing the terminals 2A is formed centrally of the insulating layer 4B1 as shown in FIG. 9(c). In addition, the main substrate 1, the provisional substrate 5, and the insulating film 4B1 are set to assume a square-shaped outward form and their outward forms are set such that the provisional substrate 5 and the insulating layer 4B1 are of the same size and the main substrate 1 is somewhat larger than the provisional substrate 5 and the insulating layer 4B1.

Figure 10:
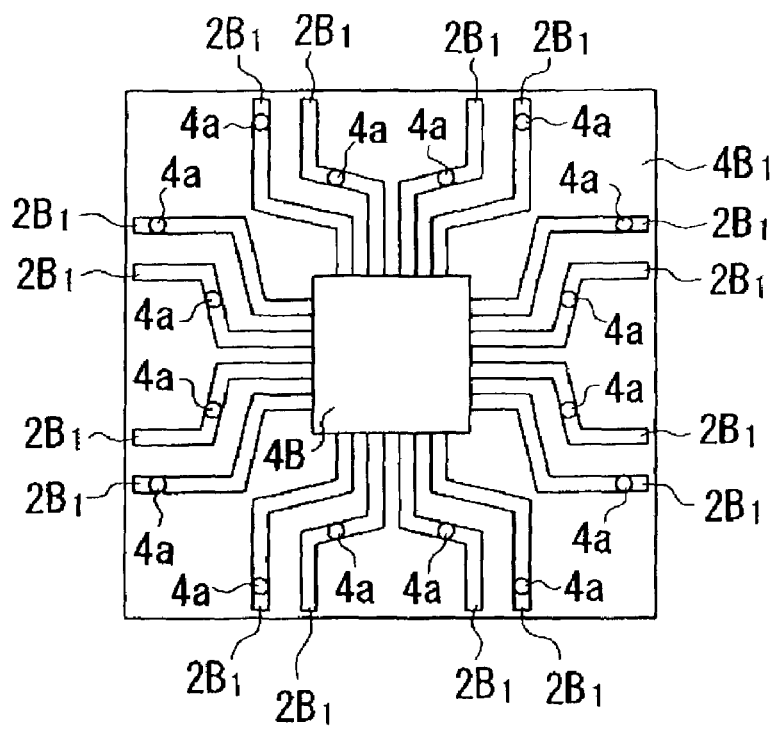
FIGS. 10(a) and 10(b) are views showing a configuration of a multilayer wiring board according to an embodiment of the invention, 10(a) being a front view showing a first layer with the insulating film of FIG. 9(c) bonded to the provisional substrate of FIGS. 9(b), and 10(b) being a front view showing a state, in which the first layer is bonded to the substrate shown in FIG. 9(a).
Figure 10:
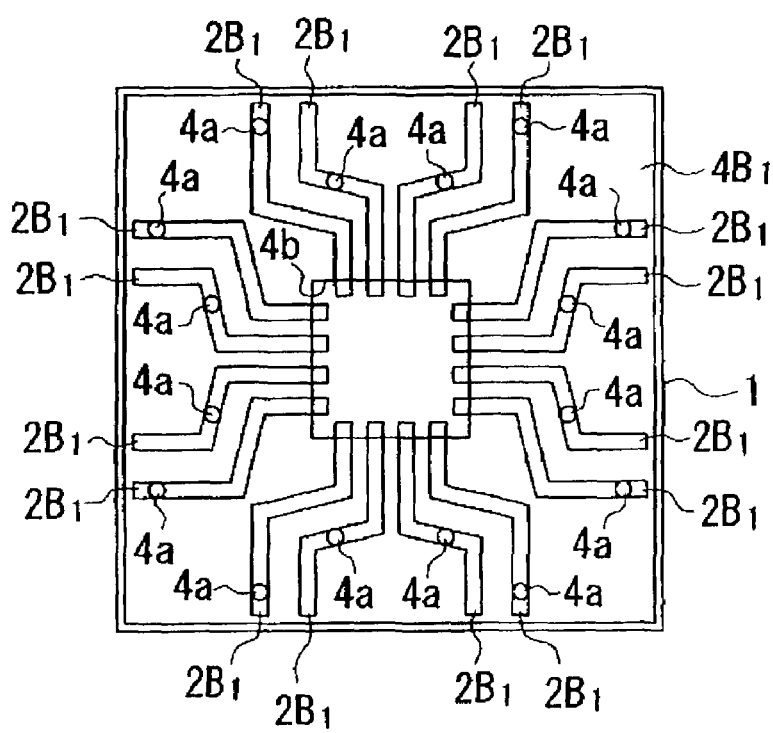

Also, in FIG. 10, (a) is a front view showing a state, in which the insulating layer 4B1 is overlapped on the provisional substrate 5 to be bonded thereto, and (b) is a front view showing a state, in which the insulating layer bonded to the provisional substrate 5 is bonded to the substrate 1, that is, a state, in which the first layer is formed on the substrate 1.

The provisional substrate 5 and the insulating layer 4B1, which assume the same outward form, are overlapped on each other in a state, in which they are positioned relative to each other, and adhered to each other by the adhesive layer 3B1 provided on an underside of the insulating layer 4B1 as shown in FIG. 10(a). In this state, the respective through-holes 4a are positioned just above the predetermined wirings 2B1. And such insulating layer 4B1 is positioned relative to and bonded to the main substrate 1 as shown in FIG. 10(b) in a state, in which the provisional substrate 5 is removed, that is, only the wirings 2B1 are bonded to the insulating layer 4B1. In this state, the respective terminals 2A on the main substrate 1 contact with the predetermined wirings 2B1 in a partially overlapping state and the remaining portions of the terminals are exposed outside the terminal opening 4b.

Figure 11:
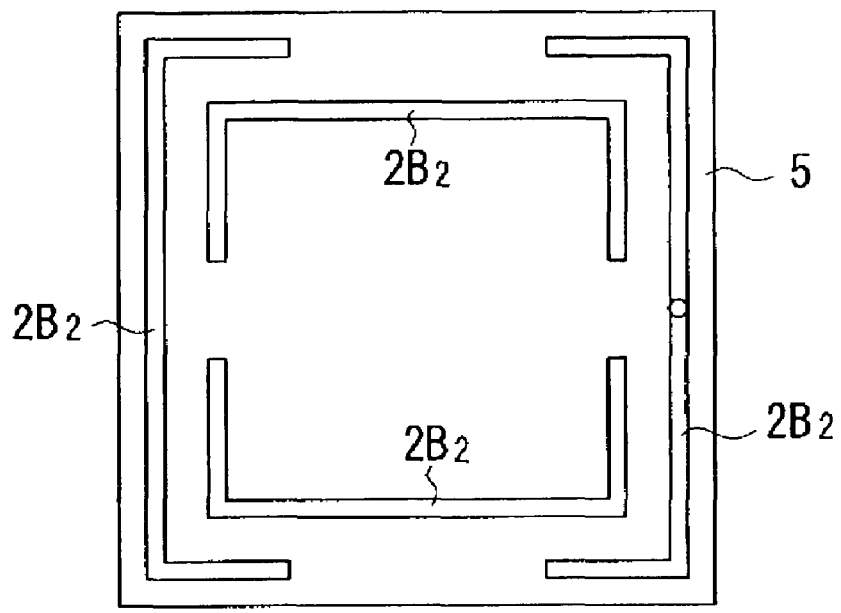
FIGS. 11(a) and 11(b) are views showing a configuration of a multilayer wiring board according to an embodiment of the invention, 11(a) being a front view showing a provisional substrate, on which wirings constituting a second layer are formed, and 11(b) being a front view showing an insulating film constituting the second layer.
Figure 11:
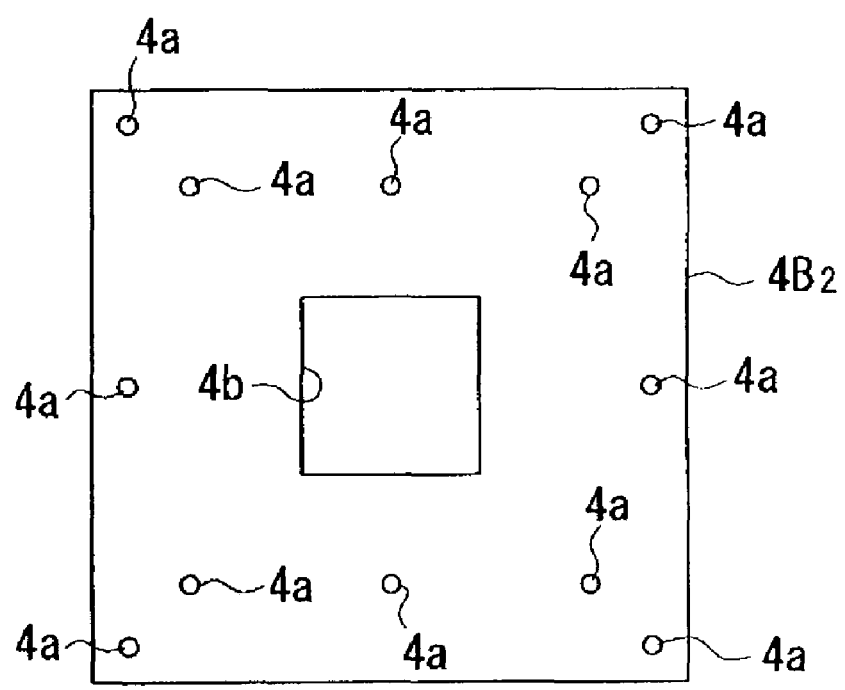
Figure 12:
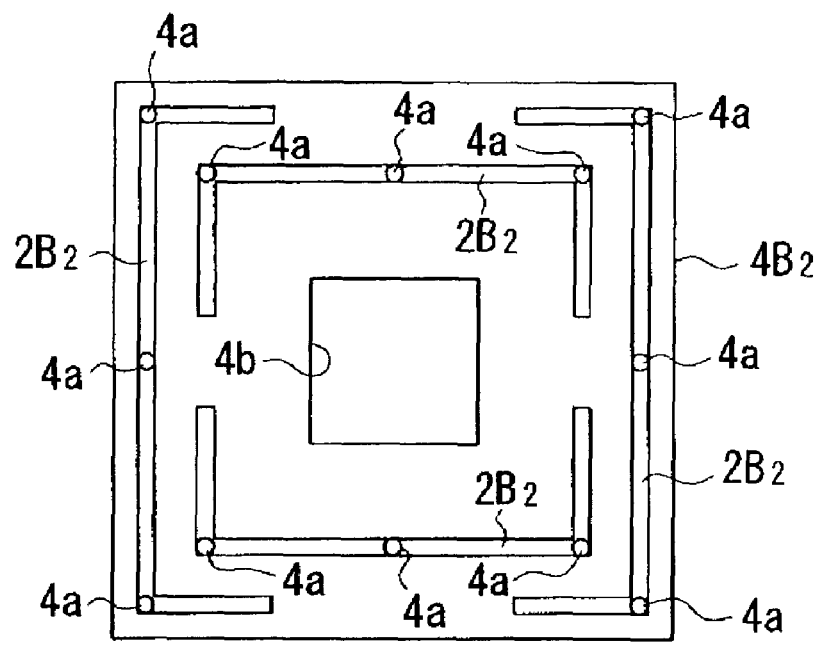
FIGS. 12(a) and 12(b) are views showing a configuration of a multilayer wiring board according to an embodiment of the invention, 12(a) being a front view showing a second layer with the insulating film of FIG. 11(b) bonded to the provisional substrate of FIG. 11(a), and 12(b) being a front view showing a state, in which the second layer is bonded to the first layer shown in FIG. 10(b).
Figure 12:
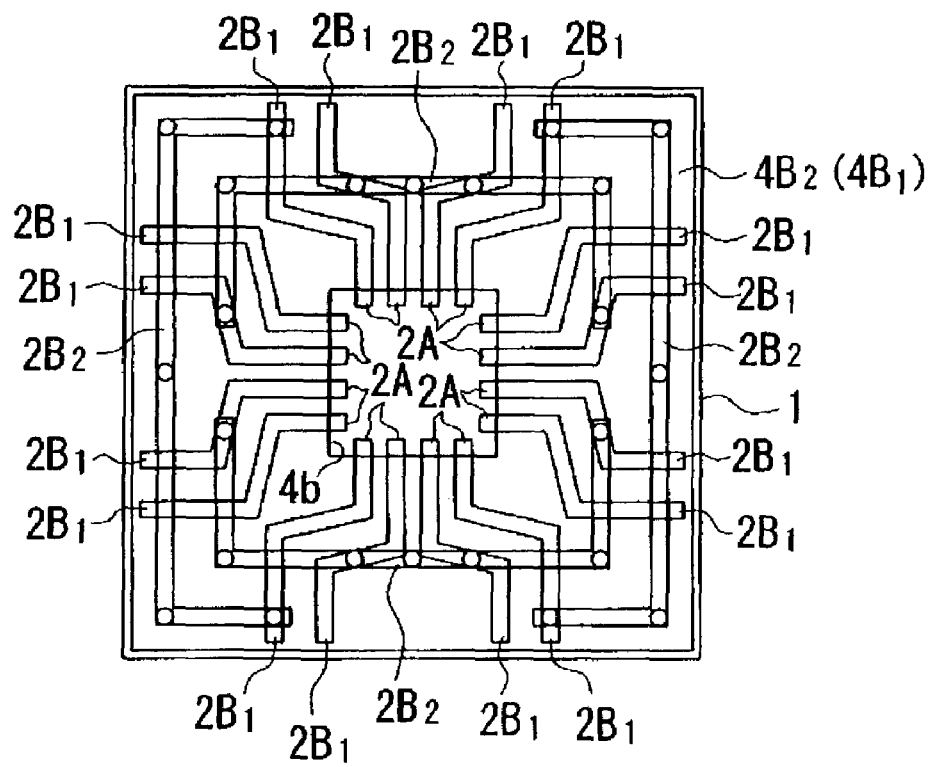

Subsequently, FIG. 11 is a front view showing structures of the provisional substrate 5 and an insulating film (insulating layer 4B2), which constitute a second layer. In FIG. 11, (a) is a front view showing the provisional substrate 5 in a state, in which wirings 2B2 of the second layer are formed, and (b) is a front view showing the insulating film (insulating layer 4B2) of the second layer. As shown in FIG. 11(a), the wirings 2B2 for connecting the wirings 2B1 of the first layer to one another are formed as line patterns, which assume predetermined shapes and are arranged in predetermined positions, on the provisional substrate 5 by means of the ink jet system.

Also, a plurality of through-holes 4a for formation of the through-holes P23 are arranged in predetermined positions in the insulating layer 4B2 and a terminal opening 4b for exposing the terminals 2A on the main substrate 1 is formed centrally of the insulating layer 4B2 as shown in FIG. 11(b). Like the provisional substrate 5 and the insulating layer 4B1, which constitute the first layer, the provisional substrate 5 and the insulating layer 4B2 are set to assume a square-shaped outward form and are of the same size in outward form.

When the insulating layer 4B2 is positioned on the provisional substrate 5 to be overlapped on and bonded to the provisional substrate, the respective through-holes 4a are positioned in predetermined positions on the wirings 2B2 as shown in FIG. 12(a). And when the ink jet system is used to form through-holes P12 in the respective through-holes 4a on the first layer shown in FIG. 10(a) and the insulating layer 4B2 is positioned to be bonded, a two-layered wiring board is finished as shown in FIG. 12(b). In the two-layered wiring board, the wirings 2B1 of the first layer are connected to the predetermined wirings 2B2 of the second layer through the through-holes P12, and thus a desired circuit is formed by the wirings 2B1 of the first layer and the wirings 2B2 of the second layer, which are connected to each other. And various signals and electric power are supplied from the outside through, for example, contact pins, or the like, to the respective terminals 2A, which are exposed outside the terminal opening 4b.

Figure 13:
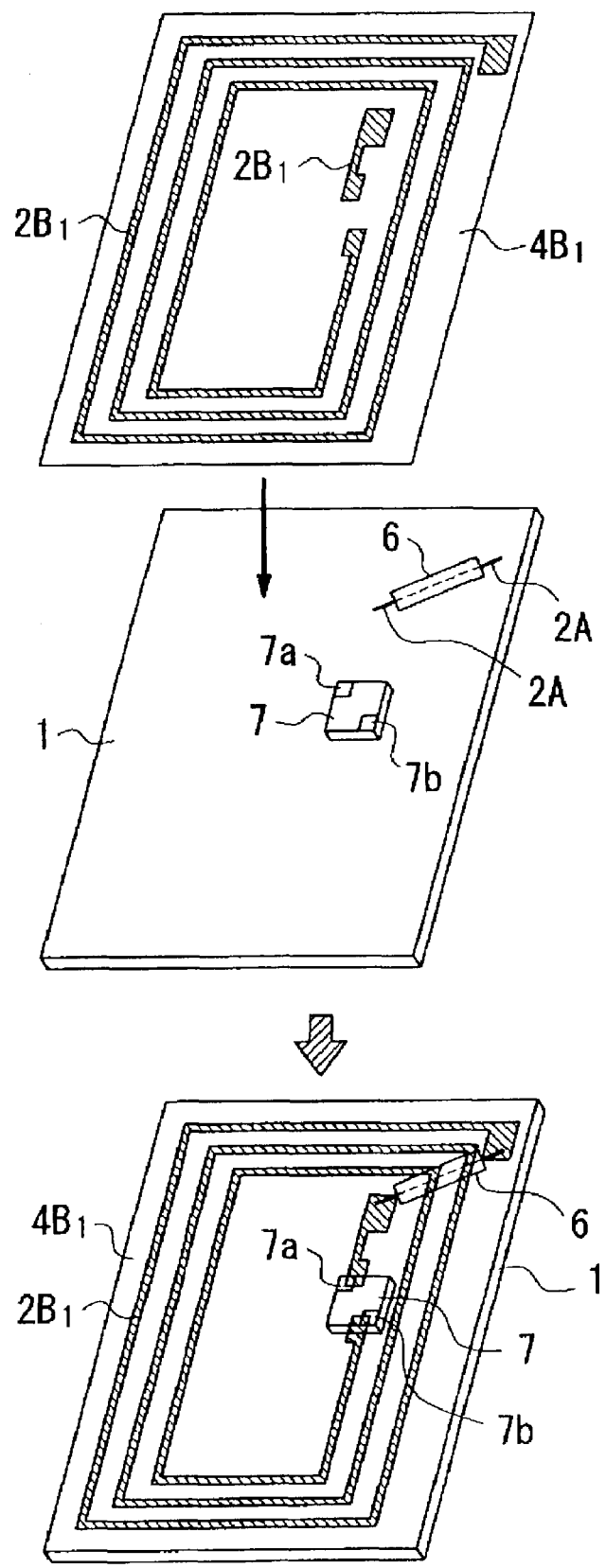
FIG. 13 is a perspective view showing a non-contact type card medium comprising a monolayered wiring pattern with a circuit element interposed between a main substrate and a first layer according to an embodiment of the invention.

Subsequently, FIG. 13 is a perspective view showing an example configuration of a non-contact type card medium comprising a monolayered wiring board with a chip circuit element (IC chip 7) interposed between a substrate 1 (main substrate) and a first layer. Two wirings 2B1 are bonded to an underside of an insulating layer 4B1. One of the wirings 2B1 is set to assume a shape of an open loop to constitute a loop antenna as shown in the figure, and the other of the wirings 2B1 is set to assume a substantially straight shape. Meanwhile, two terminals 2A are formed by providing a wiring in a predetermined position on the substrate 1 and arranging an insulating film 6 on the wiring, and the IC chip 7 in the form of a bare chip is bonded and fixed in the predetermined position. Externally connected terminals 7a, 7b are provided on an upper surface of the IC chip 7.

When the insulating layer 4B1 is positioned on the thus configured substrate 1 to be bonded thereto, the substantially straight wiring 2B1 has its end thereof overlapping and connecting to the externally connected terminal 7a and its other end overlapping and connecting to one of the terminals 2A as shown in the figure. Also, the open-loop wiring 2B1 has its one end overlapping and connecting to the externally connected terminal 7b and its other end overlapping and connecting to the other of the terminals 2A. That is, the IC chip 7 is connected by the respective wirings 2B1, so that a non-contact type card medium including a loop antenna circuit is formed. At least one of electromagnetic waves and static capacity coupling performs at least one of electricity supply and data transfer between the non-contact type card medium and an external transmitting and receiving apparatus (not shown).

As described above, the invention comprises the steps of forming wirings by application of heat treatment after the ink jet system is used to discharge a conductive liquid onto a provisional substrate having a predetermined repellent property, bonding an insulating film to the wirings with an adhesive material therebetween, peeling and removing the provisional substrate, and bonding and fixing the wirings together with the insulating film on a main substrate by an adhesive material, so that the ink jet system can be used to form favorable wirings irrespective of a quality of a substrate material. That is, instead of discharging a conductive liquid directly onto that main substrate, on which wirings are to be actually formed, to form a wiring pattern as in a conventional art with the use of the ink jet system, a conductive liquid is discharged onto a provisional substrate, which ensures a repellent property of a certain level, to previously form wirings and the wirings together with an insulating film are bonded and fixed to a main substrate by an adhesive material, so that there is no need of subjecting the main substrate to surface preparation to impart a repellent property of a certain level to the main substrate and so the forming step of multilayer wirings with the use of the ink jet system can be simplified correspondingly.

The entire disclosure of Japanese Patent Application No. 2002-119447 filed Apr. 22, 2002 is incorporated by reference.

What is claimed is:
1. A method of manufacturing a device, comprising the steps of:
(a) forming first wirings on a provisional substrate;
(b) mounting an insulating body on the first wirings to form a laminated body of the first wirings and the insulating body, the insulating body having an adhesive layer and an insulating layer;
(c) peeling off the laminated body from the provisional substrate; and

(d) mounting the laminated body on a main substrate, wherein openings are formed in the insulating body to expose at least a part of the first wirings, and further comprising, after the step (d), (e) forming a conductive layer in the openings.

2. The method of manufacturing a device, according to claim 1, wherein in the step (a), before the first wirings are formed, a surface of the provisional substrate is made to possess a property permitting the first wirings and the provisional substrate to peel off in the step (c).

3. The method of manufacturing a device, according to claim 2, wherein the property permitting the first wirings and the provisional substrate to peel off comprises a repellent property.

4. The method of manufacturing a device, according to claim 1, wherein in the step (a), the first wirings are formed by means of a droplet discharge method.

5. The method of manufacturing a device, according to claim 1, wherein the step (b) comprises bonding the insulating body to the first wirings.

6. The method of manufacturing a device, according to claim 1, wherein in the step (d), second wirings are first formed on the main substrate, and the laminated body is mounted on the main substrate in a manner to provide conduction between the second wirings and the first wirings.

7. The method of manufacturing a device, according to claim 1, wherein in the step (d), circuit terminals are first formed on the main substrate, and the laminated body is mounted on the main substrate in a manner to provide conduction between the circuit terminals and the first wirings.

8. The method of manufacturing a device, according to claim 1, wherein the openings are first formed on the insulating body prior to the step (b).

9. The method of manufacturing a device, according to claim 1, wherein the step (e) further comprises a droplet discharge method.

10. The method of manufacturing a device, according to claim 9, wherein the droplets comprise liquid bodies containing fine metallic particles.

11. The method of manufacturing a device, according to claim 1, wherein multilayer wirings are formed by forming at least one or more new laminated bodies on the laminated body which is performed in the same step as that in which the laminated body is formed,.

* * * * *